US009083322B2

(12) United States Patent　　(10) Patent No.: US 9,083,322 B2
Llewellyn　　(45) Date of Patent: Jul. 14, 2015

(54) SUBSONIC TEST SIGNAL GENERATION TECHNIQUE

(75) Inventor: William D. Llewellyn, San Jose, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 1036 days.

(21) Appl. No.: 13/180,801

(22) Filed: Jul. 12, 2011

(65) Prior Publication Data

US 2013/0016844 A1　Jan. 17, 2013

(51) Int. Cl.
*H03B 28/00*　(2006.01)
*H03K 4/02*　(2006.01)

(52) U.S. Cl.
CPC ..................... *H03K 4/023* (2013.01)

(58) Field of Classification Search
CPC .......... H03B 28/00; H03B 27/00; G06G 7/22; H03K 4/92; H03K 4/06
USPC ......................................... 327/129, 170, 112
See application file for complete search history.

(56) References Cited

U.S. PATENT DOCUMENTS

| 5,173,664 | A | 12/1992 | Petersen et al. | |
| 5,657,215 | A | 8/1997 | Faulk | |
| 7,425,849 | B2 * | 9/2008 | Gupta et al. | 327/112 |
| 7,461,281 | B2 * | 12/2008 | Miyazaki | 713/323 |
| 7,492,219 | B1 * | 2/2009 | Cyrusian | 330/10 |
| 2006/0140644 | A1 * | 6/2006 | Paolella | 398/189 |
| 2010/0146025 | A1 * | 6/2010 | Ergun | 708/251 |
| 2011/0170717 | A1 * | 7/2011 | Lim et al. | 381/120 |

FOREIGN PATENT DOCUMENTS

| CN | 1741359 A | 3/2006 |
| CN | 101079549 A | 11/2007 |
| CN | 101578526 A | 11/2009 |
| CN | 102884492 A | 1/2013 |
| CN | 202931266 U | 5/2013 |
| KR | 102013000848 A | 1/2013 |

OTHER PUBLICATIONS

"Chinese Application Serial No. 201210241114.6, Office Action mailed Sep. 16, 2014", w/English Translation, 8 pgs.

(Continued)

*Primary Examiner* — Quan Tra
(74) *Attorney, Agent, or Firm* — Schwegman Lundberg & Woessner, P.A.

(57) ABSTRACT

An apparatus includes a capacitor, a current generating circuit communicatively coupled to the capacitor, and a current pulse timing circuit communicatively coupled to the current source circuit. The current timing pulse circuit is configured to time durations of a first plurality of current pulses from the current generating circuit for charging the capacitor and a second plurality of current pulses for discharging the capacitor, and step the durations of the current pulses between a minimum duty cycle and a maximum duty cycle. A cycle of providing the first plurality of current pulses and providing the second plurality of current pulses results in generation of a subsonic pseudo-sinusoidal pulse signal at the capacitor.

15 Claims, 5 Drawing Sheets

(56) References Cited

OTHER PUBLICATIONS

"Chinese Application Serial No. 201220337533.5, Notification to Make Rectification mailed Nov. 30, 2012", w/English Claims, 27 pgs.

"Chinese Application Serial No. 201220337533.5, Response filed Jan. 14, 2013 to Notification to Make Rectification mailed Nov. 30, 2012", w/English Claims, 132 pgs.

* cited by examiner

SUBSONIC TEST SIGNAL GENERATION TECHNIQUE

BACKGROUND

Electronic systems can include audio subsystems. Audio subsystems produce sound when connected to a speaker or headphone speaker and can be found in portable electronic devices such as cellular phones, MP3 players, handheld gaming systems, and tablet or laptop computers. It can be useful to perform a calibration test on the speaker load to determine a power level to the load. A calibration test can also be used to detect cross talk between speakers in headphones. However, such a test can result in tones or clicks that are annoying to the user, or can lead the user to believe the device is not operating properly.

OVERVIEW

This document relates generally to electronic circuits, and in particular, to an electronic circuit that provides a substantially inaudible tone.

An apparatus example includes a capacitor, a current generating circuit communicatively coupled to the capacitor, and a current pulse timing circuit communicatively coupled to the current source circuit. The current timing pulse circuit is configured to time durations of a first plurality of current pulses from the current generating circuit for charging the capacitor and a second plurality of current pulses for discharging the capacitor, and step the durations of the current pulses between a minimum duty cycle and a maximum duty cycle. A cycle of providing the first plurality of current pulses and providing the second plurality of current pulses results in generation of a pseudo-sinusoidal pulse signal at the capacitor.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As explained above, it can be useful to provide a test or an automatic calibration for audio subsystems of an electronic device. Such a test or calibration can be performed when the device is first turned on to determine characteristics of the speaker load to which it is connected. However, it may be desirable for a user to be unaware of such a test. This can be accomplished by performing the test or calibration using an inaudible or substantially inaudible tone.

A tone of a sufficiently low frequency tone (or conversely, a sufficiently long period) can provide a tone that is subsonic and therefore inaudible to the user. This allows the test to be run with the tone pulse at or near its maximum amplitude without the user being aware of the test. A tone of maximum or near maximum amplitude permits good resolution for tests in which it is used. However, producing such a tone is not straightforward. One approach is to divide a clock signal down to a square wave of a subsonic frequency and then apply the necessary filtering to suppress any audible band overtones or harmonics. However, this filtering of the square wave typically requires analog circuits to implement long time constants that necessitate resistance and capacitance values that are too large to be practicable for integrated circuits (ICs). Filtering could be done with off-chip components of large values of resistance and capacitance, but use of these external components and the associated additional IC pins are undesirable.

Figure 1:
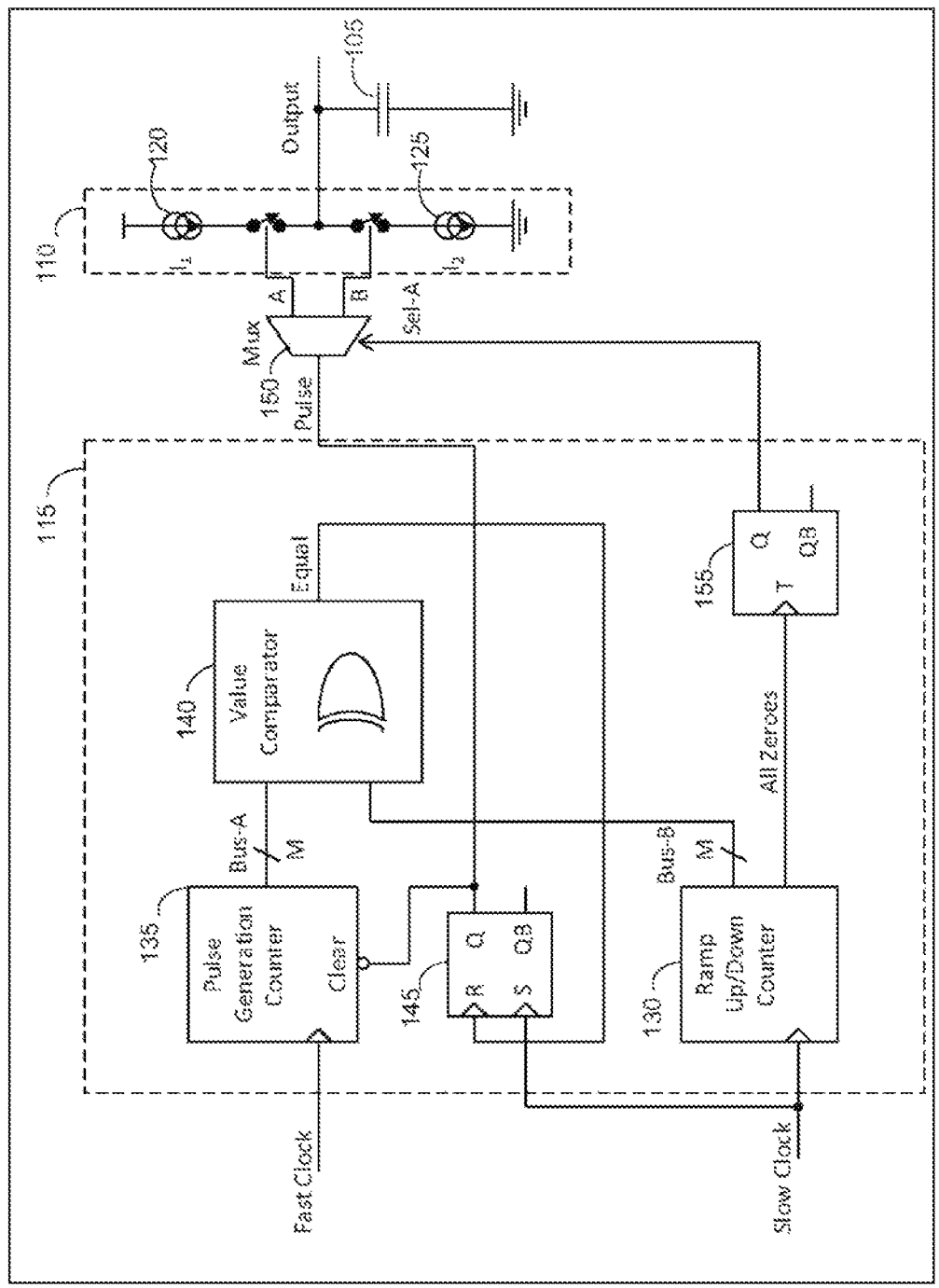
FIG. 1 shows a block diagram of an example of an electronic circuit that generates an electrical signal having a substantially inaudible frequency.

FIG. 1 shows a block diagram of an example of an electronic circuit that generates an electrical signal having a substantially inaudible frequency. All of the components of the circuit can be incorporated into a single IC. The circuit includes a capacitor 105, a current generating circuit 110 communicatively coupled to the capacitor, and a current pulse timing circuit 115 communicatively coupled to the current source circuit. The communicative coupling allows an electrical signal to be communicated between the circuits even though there may be intervening circuitry.

The current generating circuit 110 provides current pulses at the capacitor 105, including a first plurality of current pulses for charging the capacitor 105 and a second plurality of current pulses for discharging the capacitor 105. In some examples, the current generating circuit 110 includes a current source circuit 120 to charge the capacitor 105 with current $I_1$ and a current sink circuit 125 to discharge the capacitor 105 using current $I_2$. Typically, current $I_1$=current $I_2$.

The current pulse timing circuit 115 times the durations of a string of pulses or first plurality of current pulses and a second plurality of current pulses from the current generating circuit 110. The current pulse timing circuit 115 steps the durations of the current pulses between a minimum duty cycle and a maximum duty cycle. In some examples, the minimum duty cycle can be a substantially zero percent (0%) duty cycle (e.g., 0% to 10% duty cycle) and the maximum duty cycle can be a substantially one hundred percent (100%) duty cycle (e.g., 90% to 100% duty cycle).

In some examples, during the first plurality of current pulses, the current pulse timing circuit 115 increases the current pulse durations from the substantially 0% duty cycle to the substantially 100% duty cycle and decreases the current pulse duration from the substantially 100% duty cycle to the substantially 0% duty cycle. The process can then be repeated for the second plurality of current pulses.

In some examples, the current pulse timing circuit 115 includes an up/down counter circuit 130 that counts from a minimum count to a maximum count and back to the minimum count for each of the first and second plurality of current pulses, and a pulse generation counter circuit 135 that times a current pulse duration according to a count of the up/down counter circuit. The interaction of the up/down counter circuit 130 and the pulse generation counter circuit 135 can provide current pulses having a time duration that ramps up from the minimum duty cycle to the maximum duty cycle and then ramps back down to the minimum duty cycle. A complete cycle of providing the first plurality of current pulses and providing the second plurality of current pulses results in generation of a subsonic pseudo-sinusoidal pulse signal at the capacitor.

Figure 2:
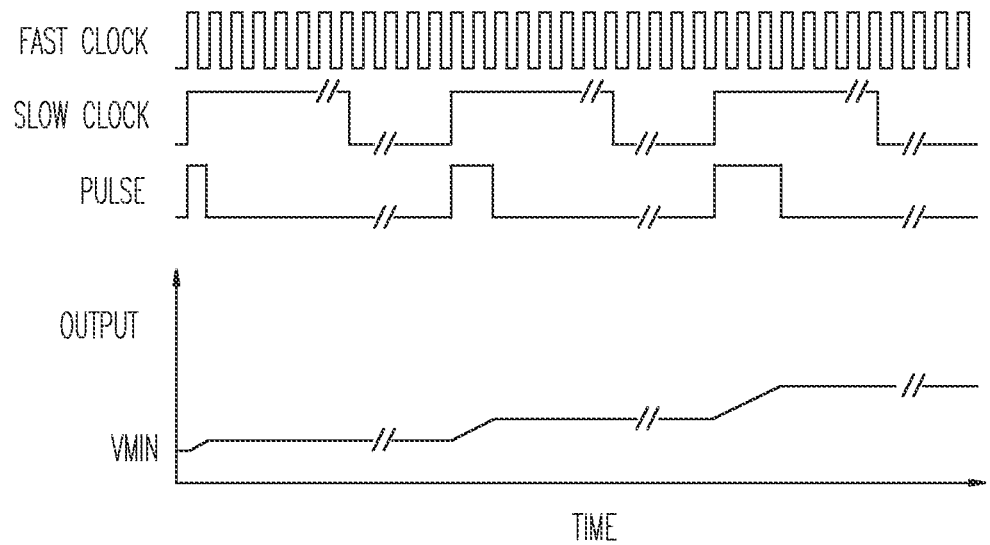
FIGS. 2-5 show an example of forming the subsonic pseudo-sinusoidal pulse signal using the circuit of FIG. 1.
Figure 3:
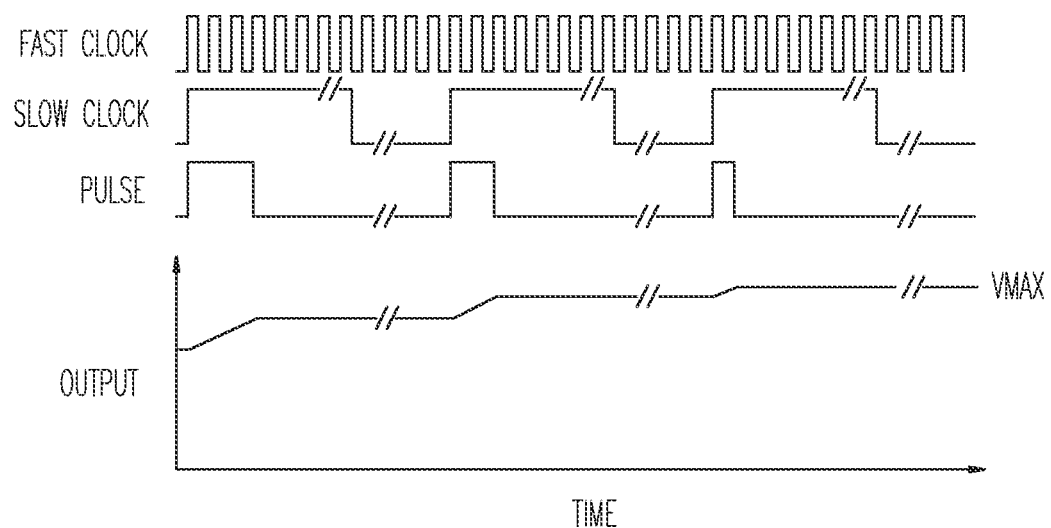
Figure 4:
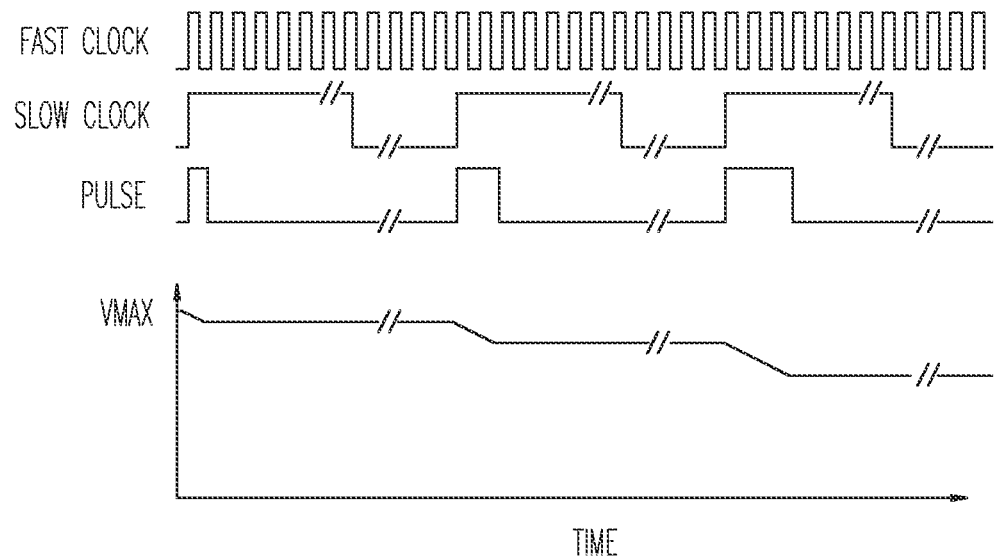
Figure 5:
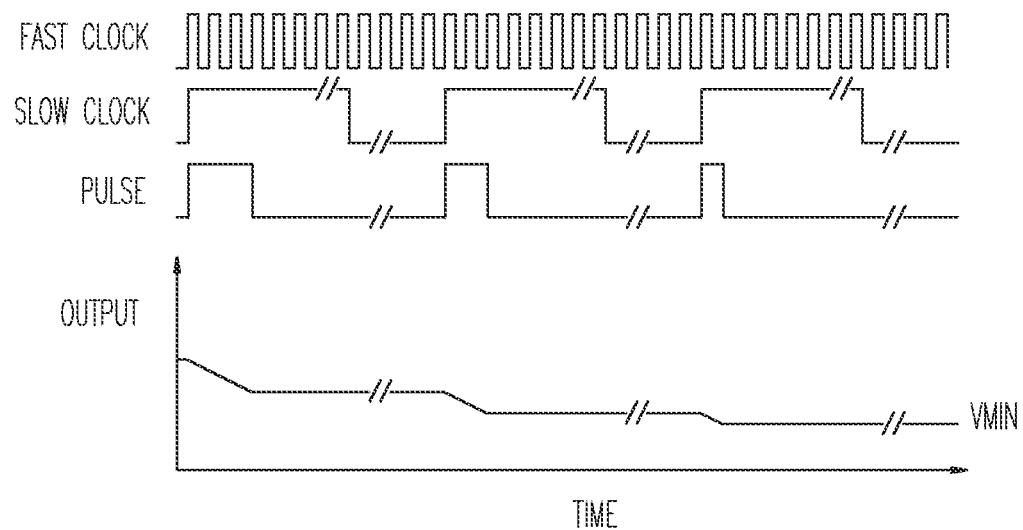
Figure 6:
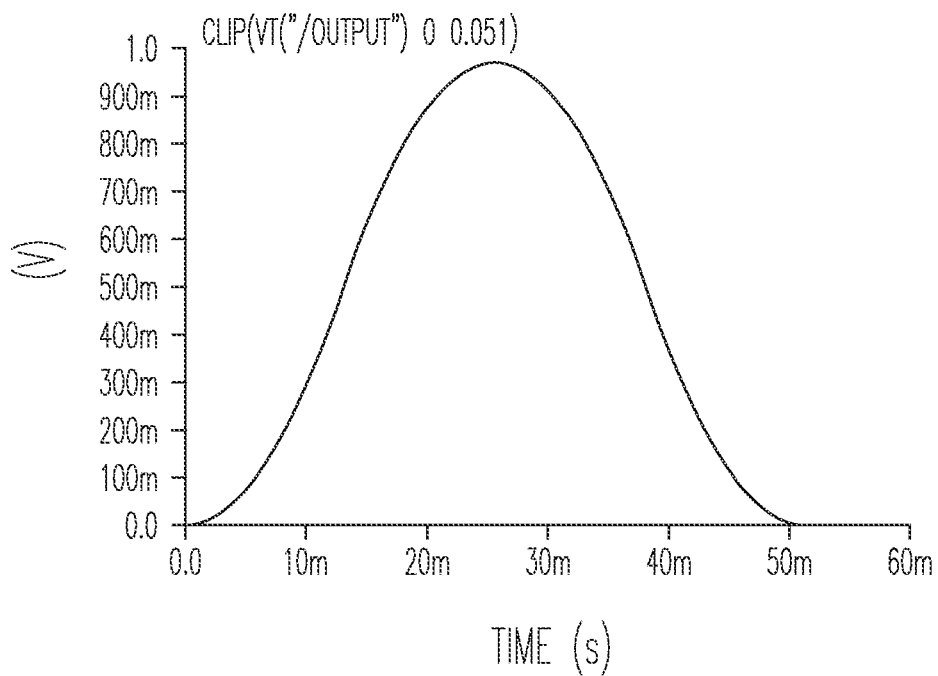
FIG. 6 shows an example of a pseudo-sinusoidal output pulse signal generated using the circuit of FIG. 1.

FIGS. 2-5 shows an example of forming the subsonic pseudo-sinusoidal pulse signal through the charging and discharging of the capacitor 105. FIG. 6 shows a simulation of the circuit of FIG. 1 and the resulting pseudo-sinusoidal pulse signal. FIGS. 2 and 3 show current timing pulses that enable current $I_1$ in current source circuit 120. The up/down counter circuit 130 in FIG. 1 includes an input to receive a first clock signal (SLOW CLOCK) and the pulse generation counter circuit 135 includes an input to receive a second clock signal having a higher frequency than the first clock signal (FAST CLOCK).

Upon the arrival of a transition (e.g., a rising edge) of the SLOW CLOCK signal, the up/down counter circuit 130 increments by one count. In some examples, the current pulse timing circuit 115 includes a comparison circuit 140 communicatively coupled to the up/down counter circuit 130 and the pulse generation counter circuit 135. The comparison circuit 140 compares the output of the up/down counter circuit 130 and the output of the pulse generation counter circuit 135 and generates a current enabling timing pulse until a count of the pulse generation counter circuit becomes equal to a count of the ramp up/down counter circuit. In the example shown, the circuit node labeled "EQUAL" goes low. The circuit node labeled "PULSE" then goes high. The PULSE signal is a current timing pulse to enable current to charge the capacitor 105 when the up/down counter circuit 130 increments by one.

The transition of SLOW CLOCK causes the counts of the two counter circuits to be not equal, which causes the pulse generation counter circuit 135 to begin counting. The FAST CLOCK signal will clock the pulse generation counter circuit 135 until its output (BUS–A) equals the output of the up/down counter circuit 130 (BUS –B), at which time EQUAL goes high and PULSE goes low. Because the pulse generation counter circuit 135 starts its count from zero, the number of Fast Clock periods needed for BUS –A to equal BUS –B is the value of BUS –B.

The current pulse timing circuit 115 may include a reset circuit 145 communicatively coupled to a reset input of the pulse generation counter circuit 135. In the example shown, the reset circuit 145 includes an RS-type asynchronous latch circuit. The reset circuit 145 generates a reset signal when a count of the pulse generation counter circuit becomes equal to a count of the ramp up/down counter circuit (e.g., when BUS –A equals BUS –B). When the pulse generation counter circuit 135 is reset, the value of BUS –A returns to all zeroes. BUS –B retains its value until the next transition of SLOW CLOCK.

Thus, as shown in FIG. 2, on the first transition of SLOW CLOCK, the width of the first PULSE signal is one period of the FAST CLOCK signal. The width of the second PULSE signal after the second transition of SLOW CLOCK is two clock periods of FAST CLOCK, the width of the third PULSE signal after the third transition of Slow Clock is three periods of FAST CLOCK, and so on.

In some examples, the counting continues, the up/down counter circuit 130 reaches its maximum count, and the width of the PULSE signal is equal to this maximum count of FAST CLOCK periods. In some examples, the width of the PULSE signal becomes equal to the period of the SLOW CLOCK signal at the maximum count. In FIG. 2, the "OUTPUT" signal is the voltage on the capacitor 105 as a result of the charging by the current source circuit 120 enabled by the current timing pulses. The voltage is integrating upward, the size of the charging steps is increasing, and the slope of the voltage on the capacitor is increasing. The OUTPUT signal in FIG. 2 corresponds to the first quarter of the output pulse signal in FIG. 6.

When the up/down counter circuit 130 reaches its maximum count, its count begins to decrement. The width of the PULSE signal decreases by one period of the FAST CLOCK signal according to the count. This is shown in FIG. 3. The capacitor voltage is still integrating upward from the charging by $I_1$, but the size of the steps is decreasing (due to the narrowing width of the PULSE signal) and the slope of the voltage is decreasing. The OUTPUT signal in FIG. 3 corresponds to the second quarter of the output pulse signal in FIG. 6.

In some examples, the circuit includes a multiplexer circuit 150 that receives a current enabling timing pulse from the current pulse timing circuit and provides the current enabling timing pulse to one of the current source circuit 120 or the current sink circuit 125. When the up/down counter circuit 130 is traversing the first cycle of up/down counting, the multiplexer circuit 150 provides current enabling timing pulses to current source circuit 120.

The up/down counter circuit then begins a second cycle of up/down counting. During this cycle, the multiplexer circuit 150 provides current enabling timing pulses to current sink circuit 125. In some examples, the circuit includes a toggle circuit 155 communicatively coupled to a select input of the multiplexer circuit 150. In some examples, the toggle circuit 155 switches the current enabling timing pulses between the current source circuit 120 and the current sink circuit 125 when the up/down counter circuit 130 counts from the minimum count to the maximum count and back to the minimum count.

During the second cycle, the up/down counter circuit 130 again begins by counting up. Because the current pulses are provided to the current sink circuit 125, the voltage on the capacitor 105 is integrating downwards, the size of the steps is increasing, and the absolute value of the negative slope of the voltage is increasing. The OUTPUT signal in FIG. 4 corresponds to the third quarter of the output pulse signal in FIG. 6.

When the up/down counter circuit 130 reaches its maximum count, its count begins to decrement. The width of the PULSE signal decreases by one period of the FAST CLOCK signal based on the count. This is shown in FIG. 5. The capacitor voltage is still integrating downward from the discharging by $I_2$, but the size of the steps is decreasing (due to the narrowing width of the Pulse signal) and the absolute value of the slope of the voltage is decreasing. The OUTPUT signal in FIG. 5 corresponds to the final quarter of the output pulse signal in FIG. 6.

FIG. 6 shows assembly of the charging and discharging by currents $I_1$ and $I_2$ into a pseudo-sinusoidal pulse signal. During the first cycle of counting, the up/down counter counts from the minimum to the maximum count and the voltage at the capacitor begins to trend upwards with a shallow but gradually increasing slope, reaching a maximum slope when the up/down counter circuit 130 reaches its maximum count value. As the up/down counter circuit 130 begins to decrease its count, the voltage at the capacitor seamlessly continues ascending but the slope begins to decrease. The slope eventually reaches zero when the up/down counter circuit 130 reaches its minimum count value (e.g., zero), and the voltage at the capacitor reaches its maximum voltage. The value of the maximum voltage is dependent on the size of the capacitor and on the values of the charging and discharging currents, $I_1$ and $I_2$. In certain examples, the currents and capacitor are sized so that the maximum voltage is about one volt (1V).

During the second cycle of counting, the voltage of the capacitor begins to trend downward with increasing negative slope. The maximum negative slope is reached when the up/down counter circuit 130 reaches its maximum count. The up/down counter circuit 130 then begins to count down and the voltage on the capacitor seamlessly continues descending as the absolute value of the slope begins to lessen and eventually reaches zero as the up/down counter circuit 130 reaches its minimum count. At this point, the capacitor voltage reaches its starting value. The output pulse in FIG. 6 may be pseudo-sinusoidal because the assembled output pulse may not have the roundness of a true sine wave.

If only one pulse is needed for the test or calibration, the counting sequence terminates after the first two complete cycles of counting. In some examples, the cycles of counting repeat and continue for as long as the tone is required for the test. In some examples, a "Start" signal is provided to the circuit in FIG. 1 to begin operation of the circuit.

Because the up/down counter circuit 130 completes two up/down counting cycles for one period of the pseudo-sinusoidal output pulse, the time period for the up/down counter circuit 130 to count from the minimum count to the maximum count and back to the minimum count for each of the first and second plurality of current pulses should be less than a time period of the generated subsonic pseudo-sinusoidal pulse signal. For example, if the frequency for the inaudible tone is desired to be twenty hertz (20 Hz), the time period for the up/down counter circuit 130 to count from the minimum count to the maximum count and back to the minimum count for each of the first and second plurality of current pulses should be less than 0.05 seconds (1/20 Hz).

To avoid overtones in the resulting pseudo-sinusoidal output signal, the rate at which the up/down counter circuit 130 changes count should correspond to a substantially inaudible frequency. This affects the size of the up/down counter circuit 130. For instance, the up/down counter circuit may include an M-bit up/down counter circuit, M being a positive integer. Because the comparison circuit 140 looks for a match between the values of the up/down counter circuit 130 and the pulse generation counter circuit 135, the size of the pulse generation counter circuit 135 may match the size of the up/down counter circuit 130 (e.g., the number of bits in BUS-A is also M).

The frequency of the Slow Clock signal can be $4*2^M$ times a desired fundamental frequency of the subsonic pseudo-sinusoidal pulse signal. For instance, if the desired frequency of the pseudo-sinusoidal output pulse signal is a subsonic frequency of 20 Hz, the frequency of the Slow Clock signal can be 20,480 Hz if M=8. The frequency of the Fast Clock signal is $2^M$ times the frequency of the first clock signal or 5.24288 MHz. Thus, choosing M=8 results in a count rate of the up/down counter circuit 130 at a frequency that is above the frequency range of normal hearing.

Figure 7:
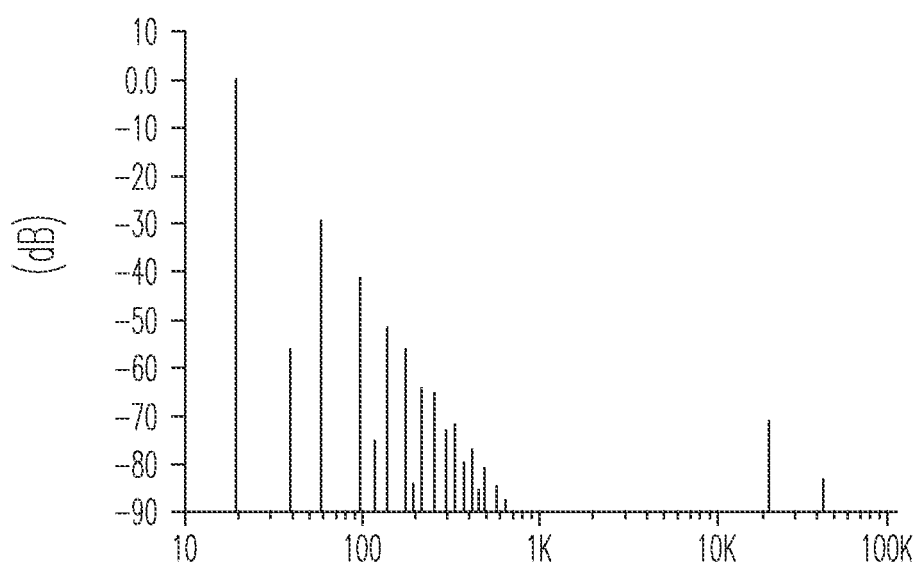
FIG. 7 shows a discrete Fourier transform (DFT) of the pseudo-sinusoidal output pulse signal.

FIG. 7 shows a discrete Fourier transform (DFT) of the pseudo-sinusoidal output pulse signal. The DFT shows the fundamental frequency of the pseudo-sinusoidal pulse is 20 Hz. The component of the resulting output signal at 20 kHz due to the SLOW CLOCK signal is shown to be attenuated down about seventy decibels (70 dB) from the component at the fundamental frequency. Different subsonic frequencies can be realized by the circuit by using different clocking frequencies and different size counters.

Figure 8:
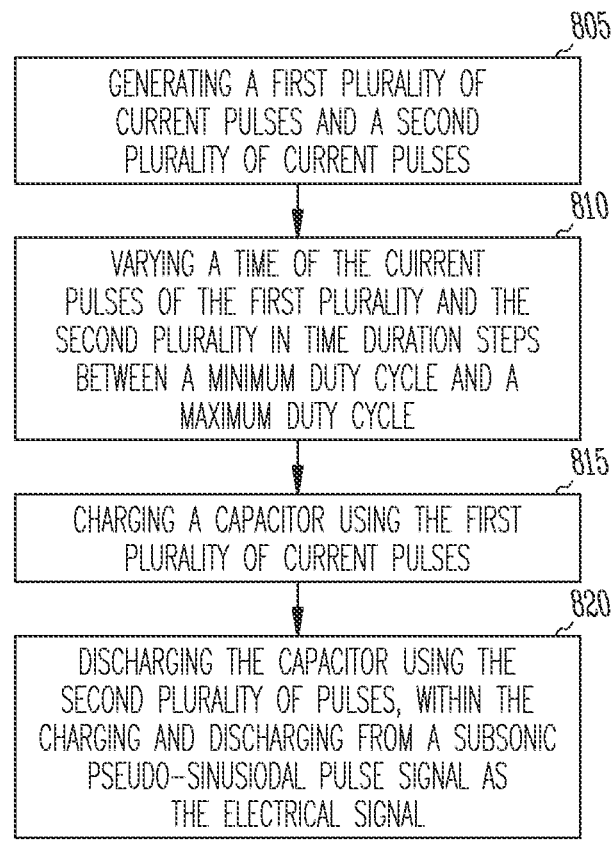
FIG. 8 shows a method of operating an electrical circuit to generate an electrical signal having a substantially inaudible frequency.

FIG. 8 shows a method 800 of operating an electrical circuit to generate an electrical signal having a substantially inaudible frequency. At block 805, a first plurality of current pulses and a second plurality of current pulses are generated. The second plurality of pulses follows the first plurality of pulses.

At block 810, the time duration of the current pulses of the first plurality and the second plurality are varied in time duration steps between a minimum duty cycle and a maximum duty cycle. In some examples, the duration of the current pulses is ramped between the minimum and maximum duty cycles.

At block 815, charging a capacitor using the first plurality of current pulses charges a capacitor and at 820, the second plurality of current pulses discharges the capacitor. The charging and discharging of the capacitor form a subsonic pseudo-sinusoidal pulse signal as the electrical signal, such as the output signal pulse shown in FIG. 6.

The subsonic pseudo-sinusoidal pulse signal can be provided to at least one of a speaker or a headphone speaker by an electronic device to perform a device test or calibration. It can be seen that the described circuits and methods consume very little current and because the large time constant components (e.g., large valued resistors and capacitors) are not used, the circuits require only a small amount of an area on an integrated circuit die.

NOTES AND EXAMPLES

Example 1 includes subject matter (such as an apparatus) comprising a capacitor, a current generating circuit communicatively coupled to the capacitor, and a current pulse timing circuit communicatively coupled to the current source circuit and configured to time durations of a first plurality of current pulses from the current generating circuit for charging the capacitor and a second plurality of current pulses for discharging the capacitor, and step the durations of the current pulses between a minimum duty cycle and a maximum duty cycle. A cycle of providing the first plurality of current pulses and providing the second plurality of current pulses results in generation of a pseudo-sinusoidal pulse signal at the capacitor.

In Example 2, the subject matter of Example 1 can optionally include a current pulse timing circuit configured to increase the current pulse durations from the minimum duty cycle to the maximum duty cycle and decrease the current pulse duration from the maximum duty cycle to the minimum duty cycle during each of the first and second plurality of current pulses.

In Example 3, the subject matter of one or any combination of Example 1 and 2 can optionally include a current pulse timing circuit that in turn includes an up/down counter circuit configured to count from a minimum count to a maximum count and back to the minimum count for each of the first and second plurality of current pulses, and a pulse generation counter circuit configured to time a current pulse duration according to a count of the up/down counter circuit.

In Example 4, the subject matter of one or any combination of Examples 1-3 can optionally include a current generating circuit that in turn includes a current source circuit configured to charge the capacitor according to current enabling timing pulses received from the current pulse timing circuit, and a current sink circuit configured to discharge the capacitor according to the current enabling timing pulses.

In Example 5, the subject matter of one or any combination of Examples 1-4 can optionally include a multiplexer circuit configured to receive a current enabling timing pulse from the current pulse timing circuit and provide the current enabling timing pulse to one of the current source circuit or the current sink circuit, and a toggle circuit communicatively coupled to a select input of the multiplexer circuit. The toggle circuit can be configured to switch the current enabling timing pulses between the current source circuit and the current sink circuit when the up/down counter counts from the minimum count to the maximum count and back to the minimum count.

In Example 6, the subject matter of one or any combination of Examples 1-5 can optionally include a current pulse timing circuit that in turn includes a comparison circuit communicatively coupled to the up/down counter circuit and the pulse generation circuit, and an up/down counter circuit that includes an input to receive a first clock signal and the pulse generation counter circuit includes an input to receive a second clock signal having a higher frequency than the first clock signal. A transition on the first clock signal can optionally causes the pulse generation counter circuit to begin counting, and the comparison circuit can optionally be configured to generate a current enabling timing pulse until a count of the pulse generation counter circuit becomes equal to a count of the ramp up/down counter circuit.

In Example 7, the subject matter of one or any combination of Examples 1-6 can optionally include a current pulse timing circuit that is turn includes a reset circuit communicatively coupled to a reset input of the pulse generation counter circuit. The reset circuit can optionally be configured to generate a reset signal when a count of the pulse generation counter circuit becomes equal to a count of the ramp up/down counter circuit.

In Example 8, the subject matter of one or any combination of Examples 1-7 can optionally include an up/down counter circuit having a time period for the up/down counter circuit to count from the minimum count to the maximum count and back to the minimum count for each of the first and second plurality of current pulses that can be less than a time period of the generated pseudo-sinusoidal pulse signal.

In Example 9, the subject matter of one or any combination of Examples 1-8 can optionally include an M-bit up/down counter circuit and an M-bit pulse generation counter circuit, M being a positive integer. The up/down counter circuit can optionally include an input to receive a first clock signal and the pulse generation counter circuit can optionally includes an input to receive a second clock signal having a higher frequency than the first clock signal. The frequency of the first clock signal can be $4*2^M$ times a desired fundamental frequency of the pseudo-sinusoidal pulse signal.

In Example 10, the subject matter of Example 9 can optionally include a second clock signal having $2^M$ times the frequency of the first clock signal.

In Example 11, the subject matter of one or any combination of Examples 1-10 can optionally include a minimum duty cycle of substantially zero percent (0%) duty cycle and a maximum duty cycle of substantially one hundred percent (100%) duty cycle.

In Example 12, the subject matter of one or any combination of Examples 1-12 can optionally include generating a subsonic pseudo-sinusoidal pulse signal during a cycle of providing the first plurality of current pulses and providing the second plurality of current pulses.

Example 13 can include subject matter, or can optionally be combined with the subject matter of one or any combination of Examples 1-12 to include such subject matter (such as a method, a means for performing acts, or a machine-readable medium including instructions that, when performed by the machine, cause the machine to perform acts) comprising generating a first plurality of current pulses and a second plurality of current pulses, varying a time duration of the current pulses of the first plurality and the second plurality in time duration steps between a minimum duty cycle and a maximum duty cycle, charging a capacitor using the first plurality of current pulses, and discharging the capacitor using the second plurality of current pulses. The charging and discharging form a pseudo-sinusoidal pulse signal as the electrical signal.

Such subject matter can include a means for generating a first plurality of current pulses and a second plurality of current pulses. Illustrative examples of which include a current generating circuit, a current source circuit, a current sink circuit and/or a current pulse timing circuit.

Such subject matter includes a means for varying the time duration of the current pulses of the first plurality and the second plurality in time duration steps between a minimum duty cycle and a maximum duty cycle. Illustrative examples of which include a current pulse timing circuit, an up/down counter timing circuit, and/or a pulse generation counter circuit.

Such subject matter can include charging a capacitor using the first plurality of current pulses, illustrative examples of which include a current source circuit and a switch circuit. Such subject matter can include discharging a capacitor using the second plurality of current pulses, illustrative examples of which include a current sink circuit and a switch circuit.

In Example 14, the subject matter of Example 13 can optionally include increasing the current pulse duration from the minimum duty cycle to the maximum duty cycle, and decreasing the current pulse duration from the maximum duty cycle to the minimum duty cycle.

In Example 15, the subject matter of one or any combination of Examples 13 and 14 can optionally include generating a count using an up/down counter to generate the plurality of current pulses, and timing the current pulse duration according to the generated count, wherein the current pulse duration increases while the up/down counter counts up and decreases while the up/down counter counts down, and wherein the up/down counter counts both up and down during generation of each of the first and second plurality of current pulses.

In Example 16, the subject matter of one or any combination of Examples 13-15 can optionally include the second plurality of current pulses following the first plurality of current pulses, and the time period sufficient to count up/down for the first plurality and to count up/down for the second plurality being less than or equal to a time period of the pseudo-sinusoidal pulse signal.

In Example 17, the subject matter of one or any combination of Examples 13-16 can optionally include enabling a current source circuit to generate the first plurality of current pulses, enabling a current sink circuit to generate the second plurality of current pulses, such that the charging and discharging form a subsonic pseudo-sinusoidal pulse signal as the electrical signal.

Example 18 can include subject matter, or can optionally be combined with the subject matter of one or any combination of Examples 1-17 to include such subject matter, such as an electronic system including a test circuit to generate a test tone. The test circuit comprises a capacitor, a current generating circuit communicatively coupled to the capacitor, and a current pulse timing circuit communicatively coupled to the current source circuit and configured to time durations of a first plurality of current pulses from the current generating circuit for charging the capacitor and a second plurality of current pulses for discharging the capacitor, and step the durations of the current pulses between a minimum duty cycle and a maximum duty cycle. A cycle of providing the first plurality of current pulses and providing the second plurality of current pulses results in generation of a pseudo-sinusoidal pulse signal at the capacitor.

In Example 19, the subject matter of Example 18 can optionally include a current pulse timing circuit configured to increase the current pulse durations from the minimum duty cycle to the maximum duty cycle and decrease the current pulse duration from the maximum duty cycle to the minimum duty cycle during each of the first and second plurality of current pulses.

In Example 20, the subject matter of one or any combination of Examples 18 and 19 can optionally include an up/down counter circuit configured to count from a minimum count to a maximum count and back to the minimum count for each of the first and second plurality of current pulses, and a pulse generation counter circuit configured to time a current pulse duration according to a count of the up/down counter circuit.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile computer-readable media during execution or at other times. These computer-readable media can include, but are not limited to, hard disks, removable magnetic disks, removable optical disks (e.g., compact disks and digital video disks), magnetic cassettes, memory cards or sticks, random access memories (RAM's), read only memories (ROM's), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
    a capacitor;
    a current generating circuit communicatively coupled to the capacitor; and
    a current pulse timing circuit communicatively coupled to the current generating circuit and configured to time durations of a first plurality of current pulses from the current generating circuit for charging the capacitor and a second plurality of current pulses for discharging the capacitor, and step the durations of the current pulses between a minimum duty cycle and a maximum duty cycle, wherein the current pulse timing circuit is configured to increase the current pulse durations from the minimum duty cycle to the maximum duty cycle and decrease the current pulse duration from the maximum duty cycle to the minimum duty cycle during each of the first and second plurality of current pulses, wherein the current pulse timing circuit includes: an up/down counter circuit configured to count from a minimum count to a maximum count and back to the minimum count for each of the first and second plurality of current pulses; and a pulse generation counter circuit configured to time a current pulse duration according to a count of the up/down counter circuit, and wherein a cycle of providing the first plurality of current pulses and providing the second plurality of current pulses results in generation of a pseudo-sinusoidal pulse signal at the capacitor.

2. The apparatus of claim 1, wherein the current generating circuit includes:
    a current source circuit configured to charge the capacitor according to current enabling timing pulses received from the current pulse timing circuit; and
    a current sink circuit configured to discharge the capacitor according to the current enabling timing pulses.

3. The apparatus of claim 2, including:
a multiplexer circuit configured to receive a current enabling timing pulse from the current pulse timing circuit and provide the current enabling timing pulse to one of the current source circuit or the current sink circuit; and
a toggle circuit communicatively coupled to a select input of the multiplexer circuit, wherein the toggle circuit is configured to switch the current enabling timing pulses between the current source circuit and the current sink circuit when the up/down counter counts from the minimum count to the maximum count and back to the minimum count.

4. The apparatus of claim 1, wherein the current pulse timing circuit includes a comparison circuit communicatively coupled to the up/down counter circuit and the pulse generation circuit,
wherein the up/down counter circuit includes an input to receive a first clock signal and the pulse generation counter circuit includes an input to receive a second clock signal having a higher frequency than the first clock signal,
wherein a transition on the first clock signal causes the pulse generation counter circuit to begin counting, and
wherein the comparison circuit is configured to generate a current enabling timing pulse until a count of the pulse generation counter circuit becomes equal to a count of the ramp up/down counter circuit.

5. The apparatus of claim 4, wherein the current pulse timing circuit includes a reset circuit communicatively coupled to a reset input of the pulse generation counter circuit, wherein the reset circuit is configured to generate a reset signal when a count of the pulse generation counter circuit becomes equal to a count of the ramp up/down counter circuit.

6. The apparatus of claim 1, wherein a time period for the up/down counter circuit to count from the minimum count to the maximum count and back to the minimum count for each of the first and second plurality of current pulses is less than a time period of the generated pseudo-sinusoidal pulse signal.

7. The apparatus of claim 1,
wherein the up/down counter circuit includes an M-bit up/down counter circuit and the pulse generation counter circuit include an M-bit pulse generation counter circuit, M being a positive integer,
wherein the up/down counter circuit includes an input to receive a first clock signal and the pulse generation counter circuit includes an input to receive a second clock signal having a higher frequency than the first clock signal, and
wherein the frequency of the first clock signal is $4*2^M$ times a desired fundamental frequency of the pseudo-sinusoidal pulse signal.

8. The apparatus of claim 7, wherein a frequency of the second clock signal is $2^M$ times the frequency of the first clock signal.

9. The apparatus of claim 1, wherein the minimum duty cycle is a substantially zero percent (0%) duty cycle and the maximum duty cycle is a substantially one hundred percent (100%) duty cycle.

10. The apparatus of claim 1, wherein the generated pseudo-sinusoidal pulse signal is a subsonic pseudo-sinusoidal pulse signal.

11. A method of operating an electrical circuit to generate an electrical signal having a substantially inaudible frequency, the method comprising:
generating a first plurality of current pulses and a second plurality of current pulses, wherein generating a plurality of current pulses includes: generating a count using an up/down counter; and timing the current pulse duration according to the generated count, wherein the current pulse duration increases while the up/down counter counts up and decreases while the up/down counter counts down, and wherein the up/down counter counts both up and down during generation of each of the first and second plurality of current pulses;
varying a time duration of the current pulses of the first plurality and the second plurality in time duration steps between a minimum duty cycle and a maximum duty cycle including increasing the current pulse duration from the minimum duty cycle to the maximum duty cycle and decreasing the current pulse duration from the maximum duty cycle to the minimum duty cycle;
charging a capacitor using the first plurality of current pulses; and
discharging the capacitor using the second plurality of current pulses, wherein the charging and discharging form a pseudo-sinusoidal pulse signal as the electrical signal.

12. The method of claim 11, wherein the second plurality of current pulses follows the first plurality of current pulses and wherein a time period sufficient to count up/down for the first plurality and to count up/down for the second plurality is less than or equal to a time period of the pseudo-sinusoidal pulse signal.

13. The method of claim 11,
wherein charging a capacitor using the first plurality of current pulses includes enabling a current source circuit to generate the first plurality of current pulses,
wherein discharging the capacitor using the second plurality of pulses includes enabling a current sink circuit to generate the second plurality of current pulses, and
wherein the charging and discharging form a subsonic pseudo-sinusoidal pulse signal as the electrical signal.

14. An electronic system for driving at least one of a speaker or a headphone speaker, wherein the electronic system includes a test circuit to generate a test tone, the test circuit comprising:
a capacitor;
a current generating circuit communicatively coupled to the capacitor; and
a current pulse timing circuit communicatively coupled to the current generating circuit and configured to time durations of a first plurality of current pulses from the current generating circuit for charging the capacitor and a second plurality of current pulses for discharging the capacitor, step the durations of the current pulses between a minimum duty cycle and a maximum duty cycle, increase the current pulse durations from the minimum duty cycle to the maximum duty cycle, decrease the current pulse duration from the maximum duty cycle to the minimum duty cycle during each of the first and second plurality of current pulses, wherein the current pulse timing circuit includes: an up/down counter circuit configured to count from a minimum count to a maximum count and back to the minimum count for each of the first and second plurality of current pulses; and a pulse generation counter circuit configured to time a current pulse duration according to a count of the up/down counter circuit, and wherein a cycle of providing the first plurality of current pulses and providing the second plurality of current pulses results in generation of a pseudo-sinusoidal pulse signal at the capacitor.

15. The electronic system of claim 14, wherein the current generating circuit includes:
- a current source circuit configured to charge the capacitor according to current enabling timing pulses received from the current pulse timing circuit; and
- a current sink circuit configured to discharge the capacitor according to the current enabling timing pulses.

\* \* \* \* \*